United States Patent
Furichi

(10) Patent No.: US 8,164,376 B2
(45) Date of Patent: Apr. 24, 2012

(54) CLOCK FREQUENCY DIFFUSING DEVICE

(75) Inventor: Shuji Furichi, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/033,050

(22) Filed: Feb. 19, 2008

(65) Prior Publication Data

US 2008/0265968 A1    Oct. 30, 2008

(30) Foreign Application Priority Data

Apr. 26, 2007 (JP) ................................. 2007-116660

(51) Int. Cl.
*H03K 3/00* (2006.01)
(52) U.S. Cl. ..................................................... 327/299
(58) Field of Classification Search .................... None
See application file for complete search history.

(56) References Cited

U.S. PATENT DOCUMENTS

| | | | |
|---|---|---|---|
| 5,291,187 A * | 3/1994 | Wood et al. ....................... 345/60 |
| 5,699,005 A * | 12/1997 | Menkhoff et al. ............. 327/292 |
| 5,790,111 A * | 8/1998 | Wood et al. .................... 345/213 |
| 6,393,078 B1 * | 5/2002 | Sattler ............................ 375/346 |
| 6,737,904 B1 * | 5/2004 | Butaud et al. .................. 327/298 |
| 7,123,307 B1 * | 10/2006 | Altmann ........................ 348/497 |
| 2005/0116759 A1 * | 6/2005 | Jenkins et al. ................. 327/291 |
| 2006/0170479 A1 * | 8/2006 | Hirata et al. ................... 327/295 |

FOREIGN PATENT DOCUMENTS

| JP | 07-202652 | 8/1995 |
|---|---|---|
| JP | 2005-156859 | 6/2005 |

\* cited by examiner

*Primary Examiner* — Lincoln Donovan
*Assistant Examiner* — Khareem E Almo
(74) *Attorney, Agent, or Firm* — Taft Stettinius & Hollister LLP

(57) ABSTRACT

A clock frequency diffusing device including a multiphase clock signal generator, a random number generator, signal selectors, and a clock signal generator. The multiphase clock signal generator receives an input clock signal and produces a plurality of delayed clock signals that are delayed relative to the input clock signal by various amounts of time. The clock signal selector randomly chooses one of the delayed signals based upon random numbers generated by the random number generator and produces a selector output signal based on its chosen delayed clock signal. A clock signal generator receives the selector output signal and produces an output clock signal.

24 Claims, 17 Drawing Sheets

Fig. 4B

| Input Condition | | | Output State |
|---|---|---|---|
| Rstb | Clkp | Clkn | Clko |
| low input | --- | --- | low |
| high input | rise | --- | high |
| high input | --- | rise | hold |
| high input | fall | --- | hold |
| high input | --- | fall | low |

Fig. 5

CLOCK FREQUENCY DIFFUSING DEVICE

CROSS-REFERENCE TO RELATED APPLICATIONS

This application claims the priority benefit of Japanese application serial number 2007116660, filed Apr. 26, 2007.

INTRODUCTION TO THE INVENTION

The present invention relates to a clock frequency diffusing device that generates an output clock signal from an input clock signal, and more particularly, to a clock frequency diffusing device for reducing harmonics in a clock signal to reduce the effects of electromagnetic interference ("EMI").

As depicted in FIG. 10, a prior art clock frequency diffusing device includes an up-down counter 1. The up-down counter 1 receives an input clock signal, Clk_in, and is reset by a reset signal, Rstb. Up-down counter 1 generates a monotonously increasing and monotonously decreasing 4-bit data signal, Cnt1[3:0], that counts up and down in response to the Clk_in signal.

A voltage digital/analog converter 2 ("voltage DAC") is connected to the output of the up-down counter 1. The voltage DAC 2 is a circuit which converts the 4-bit data signal, Cnt1[3:0], into an analog voltage, VCTRL. A voltage/frequency converter 3 is connected to the output of the voltage DAC 2. The voltage/frequency converter 3 is a circuit which converts the frequency of the VCTRL signal into an output clock signal, Clko, in which the frequency of the input clock signal Clk_in is diffused.

FIG. 11 is a timing chart showing output values of the up-down counter 1 (count data Cnt1[3:0]=Cnt1[0], Cnt1[2], and Cnt1[3]) versus time. The count data Cnt1[3:0] output from the up-down counter 1 is supplied to the voltage DAC 2.

FIG. 12 is a graph of VCTRL versus time at the output of the voltage DAC 2. VCTRL changes within a range corresponding to a frequency diffusion width and varies between a minimum voltage, Vmin, and a maximum voltage, Vmax. VCTRL is supplied to the voltage/frequency converter 3 that generates the frequency-diffused output clock signal, Clko.

FIG. 13 is a graph of the frequency of the output clock signal Clko versus time. The frequency of the output clock signal, Clko, varies within a range from a minimum frequency, Fmin, to a maximum frequency, Fmax. For example, the frequency of Clko changes approximately ±5% around a center frequency of 5 MHz. The range of variation is arbitrarily set to achieve a desired frequency diffusion effect. The clock frequency diffusing device shown in FIG. 10 increases and decreases the frequency of the output clock Clko over time, thereby reducing the peak noise of EMI.

A phase-modulated clock pulse generator designed to reduce radio frequency interference ("RFI") is described in Japanese Unexamined Patent Publication No. Hei 7(1995)-202652. A clock pulse is supplied to a delay circuit with taps. One of the taps is selected by a constant-delay multiplexer, thereby producing a phase-modulated clock pulse. The application describes a circuit configuration in which the level of RFI is reduced by a frequency diffusion effect.

Japanese Unexamined Patent Publication No. 2005-156859 describes a passive drive type display device having a display panel. The display panel includes organic electroluminescent elements ("EL elements"), each corresponding to a self light-emitting element and a corresponding drive device.

When the clock signal generated by a conventional clock frequency diffusing device is used with a conventional passive type organic display device, several problems may arise.

As shown in FIG. 14, a conventional passive type organic display device may comprise, for example, a clock generator 5 including the clock frequency diffusing device shown in FIG. 10, a light emission control circuit 6, a passive drive type display panel 10, an anode drive circuit 20, and a cathode drive circuit 30. The light emission control circuit 6 may receive the clock signal from the clock signal generator 5 as well as light emission data, DA, and the light emission control circuit 6 may generate switch changeover signals S6a, S6b.

In the display panel 10, anode lines CL (=CL0, CL1, CL2, . . . , CLm), corresponding to a plurality of data lines ("display lines"), and cathode lines COM[99:0] (=COM[0], COM[1], . . . , COM[99]), corresponding to a plurality of scanning lines (e.g., 100 lines), are arranged in matrix form. EL elements 11 (=11-00, 11-01, . . . ) corresponding to self light-emitting elements are connected at positions where the display lines and scanning lines intersect. Each EL element 11 is a capacitive light-emitting element with an equivalent circuit configuration including a light-emitting element E, comprised of a diode, and a parasitic capacitance, Cp, coupled in parallel with the light-emitting element E.

The anode drive circuit 20 includes a plurality of constant current sources 21 (=21-0, 21-1, 21-2, . . . , 21-m) corresponding to drive sources. The constant current sources 21 are powered from voltage V1. Drive switches 22 (=22-0, 22-1, 22-2, . . . , 22-m) are switched in response to the switch changeover signal S6a that is supplied from the light emission control circuit 6. The drive switches 22 connect the anode lines, CL, to the constant current sources 21 or, alternatively, to ground ("GND") by toggling in response to the switch changeover signal S6a outputted from the light emission control circuit 6.

The cathode drive circuit 30 includes a plurality of scanning switches 31 (=31-0, 31-1, 31-2, . . . , 31-99) that scan the display lines COM[99:0] in sequence. The scanning switches 31 are toggled in response to the switch changeover signal S6b that is output from the light emission control circuit 6. The scanning switches 31 connect the display lines COM[99:0] to a reverse bias voltage, V2, or, alternatively, GND.

The display lines COM[99:0] are sequentially selected and scanned at predetermined time intervals in response to the switch changeover signal S6b that is output from the light emission control circuit 6. The corresponding anode line CL is driven by a constant current supplied from the constant current source 21 in response to the switch changeover signal S6a synchronized with this scanning, so that the EL element 11 at a position where the scan and display lines intersect emits light.

When, for example, the EL element 11-00 at the position where the anode line CL0 and the display line COM[0] intersect is caused to emit light, the scanning switch 31-0 is first switched to GND so that the display line COM[0] is scanned. The constant current source 21-0 is connected to the anode line CL0 by the drive switch 22-0. Further, the reverse bias voltage V2 is applied to other display lines COM[1], COM[2], . . . by the scanning switches 31-1, 31-2, . . . , respectively, and other anode lines CL1, CL2, . . . are connected to GND by the drive switches 22-1, 22-2, . . . , respectively. Thus, only the EL element 11-00 emits light because it is biased in the forward direction. All other EL elements 11 do not emit light because no current is supplied from the constant current sources 21-1, 21-2, . . . , respectively.

When a light emission control voltage (drive voltage) is applied to an EL element 11, the charge equivalent to the electric capacity of the EL element 11 flows into an electrode as a displacement current and is stored. When the drive voltage exceeds a predetermined voltage (light emission threshold voltage) specific to the EL element, current begins to flow into an organic layer constituting a light-emitting layer from the electrode (anode side of light-emitting element E), and light is emitted with an intensity (luminance) substantially proportional to the current (drive current). When the drive voltage is less than or equal to the light emission threshold voltage, little current flows into the EL element 11 and hence the EL element 11 does not emit light. Luminance increases as the drive voltage applied to the EL element increases within in a light-emittable range above than the light emission threshold voltage.

If the clock generator 5 shown in FIG. 14 is a conventional clock frequency diffusing device as shown in FIG. 10, variations may occur in the display luminance as the frequency of the output clock signal, Clko, varies. Since the frame frequency for displaying one screen also varies greatly, display non-uniformity such as flicker may occur.

In FIG. 15, 1V indicates the time width of one frame at the display lines COM[99:0], and 1H corresponds to periods (select periods) of the scanning switches 31. Each of the display lines (COM[0] through COM[99]) is turned on when logic low is output and is turned off when logic high is output.

When, for example, the frequency of the output clock signal, Clko, is 5 MHz (1/Clko=200 nS), and the frequency diffusion width is ±5%, the 1V time and the 1H time assume the following values under the following Display Conditions 1 through 3 upon setting of the frame frequency to 100 Hz.

In FIG. 15, Display Condition 1 corresponds to the conditions in the vicinity of the display lines COM[49] and COM[50] of the cathode drive waveform of the passive type EL. Since the frequency of the output clock display line is 5 MHz upon selection of 1H, and 1V indicates the average value of the display line COM[0] select period and the display line COM[99] select period, the following values are given:

$$Clko=5\text{ MHz }(1/Clko=200\text{ nS})$$

$$1V=10\text{ mS }(50{,}000\times 1/Clko)$$

$$1H=100\text{ μS }(500\times 1/Clko)$$

Display Condition 2 corresponds to the conditions in the vicinity of the display line COM[0] of the cathode drive waveform of the passive type EL shown in FIG. 15. Since 1V indicates the average value of the display line COM[0] select period and the display line COM[99] select period, the following value are given:

$$Clko=4.75\text{ MHz }(1/Clko=210\text{ nS})$$

$$1V=10\text{ mS }(50{,}000\times 1/Clko)$$

$$1H=105\text{ μS }(500\times 1/Clko)$$

Display condition 3 corresponds to the conditions in the vicinity of the display line COM[99] of the cathode drive waveform of the passive type EL shown in FIG. 15. Since 1V indicates the average value of the display line COM[0] select period to the display line COM[99] select period, the following value are given:

$$Clko=5.25\text{ MHz }(1/Clko\text{ 190 nS})$$

$$1V=10\text{ mS }(50{,}000\times 1/Clko)$$

$$1H=95\text{ μS }(500\times 1/Clko)$$

The luminance of a passive type organic display device as shown in FIG. 14 is generally expressed as the ratio of 1H to 1V ("on/off ratio"). Here, each EL element 11 is turned on during a 1H period during a 1V period and is turned off during periods other than the 1H period. The on/off ratios under Display Conditions 1 through 3 are:

1V=display conditions 1 through 3
1H=display condition 3
on/off ratio=95/10000=0.0095
1V=display conditions 1 through 3
1H=display condition 2
on/off ratio=105/10000=0.0105

Between the maximum and minimum on/off ratios, a luminance variation of approximately 10% occurs.

The phase-modulated clock pulse generator described Japanese Unexamined Patent Publication No. Hei 7(1995)-202652 is subject to EMI at harmonics of the clock signal frequency.

A clock frequency diffusing device may include a multiphase clock signal generator, a random number generator, signal selectors, and/or a clock signal generator. The multiphase clock signal generator may receive an input clock signal and may produce a plurality of delayed clock signals that may be delayed relative to the input clock signal by various amounts of time. A plurality of clock signal selectors may each randomly choose one of the delayed signals using a random number generator and each clock signal selector may produce a selector output signal based on its chosen delayed clock signal. A clock signal generator may receive the selector output signals and produce an output clock signal.

A clock frequency diffusing device according to certain aspects of the present invention includes a multiphase clock generating means which generates and outputs a plurality of phase-different first clock signals from an input clock, and output means which switches the first clock signals, based on arbitrary random numbers thereby to output an output clock signal of a diffused frequency.

In a detailed embodiment, the multiphase clock generating means delays the input clock and thereby generates and outputs the first clock signals different in phase. Further, the output means includes a random number generator which generates and outputs the arbitrary random numbers, based on the first clock signals, a clock signal selector which selects from among the first clock signals, based on the random numbers to output second clock signals, and a clock signal generator which generates and outputs the output clock signal having a diffused frequency, with logic values that correspond to the second clock signals.

In further detailed embodiments, the clock signal selector selects from among the first clock signals, based on the random numbers and outputs the second clock signals corresponding to a falling edge and a rising edge, opposite in phase. Further, the clock signal generator generates and outputs the output clock signal having a diffused frequency, with logic values that correspond to the second clock signals.

In a first aspect, a clock frequency diffusing device according to the present invention may include a multiphase clock signal generator which may output different phase-adjusted first clock signals from an input clock signal; an output circuit which may include a random number generator and which may have the first clock signals as inputs and a second clock signal as an output. The output circuit may generate a diffused frequency output clock signal on the second clock signal from the first clock signals utilizing an output of the random number generator.

In a detailed embodiment of the first aspect, the different phase-adjusted first clock signals may be different phase-delayed first clock signals, respectively delayed from the input clock signal. In another detailed embodiment of the first aspect, the output circuit may include a rising edge switch which may select a first one of the different phase-adjusted first clock signals based upon the output of the random number generator; a falling edge switch which may select a second one of the different phase-adjusted first clock signals based upon the output of the random number generator; and a clock signal generator having the selected first and second ones of the different phase-adjusted first clock signals as inputs and the diffused frequency output clock signal as an output, such that the rising edge of the diffused frequency output clock signal is based upon the selected first one of the different phase-adjusted first clock signals and such that the falling edge of the diffused frequency output clock signal is based upon the selected second one of the different phase-adjusted first clock signals.

In a second aspect of the present invention, a method for generating a diffused frequency clock signal may include the steps of converting an input clock signal into different phase-adjusted clock signals; continuously randomly selecting among the phase-adjusted clock signals; and generating the diffused frequency clock signal from the continuously randomly selected phase-adjusted clock signals.

In a detailed embodiment of the second aspect, the phase-adjusted clock signals may include different phase-delayed clock signals, respectively delayed from the input clock signal. In another detailed embodiment of the second aspect, the step of continuously randomly selecting among the phase-adjusted clock signals may include the steps of selecting a rising edge clock signal and a falling edge clock signal from the different phase-adjusted clock signals, and the generating step may include generating a rising edge of the diffused frequency clock signal from the selected rising edge clock signal and generating a falling edge of the diffused frequency clock signal from the selected falling edge clock signal. In a further detailed embodiment, the step of randomly selecting among the phase-adjusted clock signals may include a step of generating a random number and selecting one of the phase-adjusted clock signals using the generated random number. In a further detailed embodiment, each of the phase-adjusted clock signals may be respectively delayed from the input clock signal by a multiple of a delay constant. The delay of the selected rising edge clock signal may be inversely proportional to the delay of the falling edge clock signal. The step of generating a random number and selecting one of the phase-adjusted clock signals using the generated random number may occur at least once for each period of the input clock signal. The step of continuously randomly selecting among the plurality of phase-adjusted clock signals may occur at least once for each period of the input clock signal. The step of continuously randomly selecting among the plurality of phase-adjusted clock signals may occur once for each period of the input clock signal. Further, each of the phase-adjusted clock signals may be respectively delayed from the input clock signal by a multiple of a delay constant. The step of randomly selecting among the phase-adjusted clock signals may include a step of generating a random number and selecting one of the phase-adjusted clock signals using the generated random number. In another detailed aspect, the method may further include the step of driving a passive type organic display device with the diffused frequency clock signal.

In a third aspect, a clock frequency diffusing device according to the present invention may include means for generating and outputting phase-different first clock signals from an input clock signal; and means for randomly selecting among the phase-different first clock signals and outputting a diffused frequency output clock signal from the randomly selected phase-different clock signals.

In a detailed embodiment of the third aspect, the generating means may generate phase-delayed first clock signals from the input clock signal, each having a delay from the input clock signal equal to a magnitude of a delay constant. The random selecting means may include a random number generator and the selecting means may select among the phase-different first clock signals based upon an output of the random number generator. The random selecting means may include means for randomly selecting rising and falling edges of the diffused frequency output clock signal from among the phase-different first clock signals. The delay from the input clock signal of each phase-delayed first clock signal may differ from the delay from the input clock signal for every other phase-delayed first clock signal.

BRIEF DESCRIPTION OF THE SEVERAL VIEWS OF THE DRAWINGS

The detailed description particularly refers to the accompanying Figures in which:

FIG. 4B is an exemplary truth table showing the output of signal selector 61 shown in FIG. 3;

FIG. 5 is an exemplary truth table showing the output state of the clock signal generator of FIG. 1 for various input conditions;

DETAILED DESCRIPTION OF THE INVENTION

A clock frequency diffusing device according to embodiments of the present invention includes a multiphase clock signal generator, a random number generator, signal selectors, and a clock signal generator. The multiphase clock signal generator receives an input clock signal and produces a plurality of delayed clock signals that are delayed relative to the input clock signal by various amounts of time. The clock signal selector randomly chooses one of the delayed signals based upon random numbers generated by the random number generator and produces a selector output signal based on its chosen delayed clock signal. A clock signal generator receives the selector output signal and produces an output clock signal.

The present invention enables a greater reduction in EMI than conventional means by reducing clock signal harmonics. When the present invention is used to generate the clock signal for a display device, for example, it is possible to eliminate an error in integration at the time that the clock is counted, and to suppress a variation in frame frequency and a variation in on/off ratio.

Figure 1:
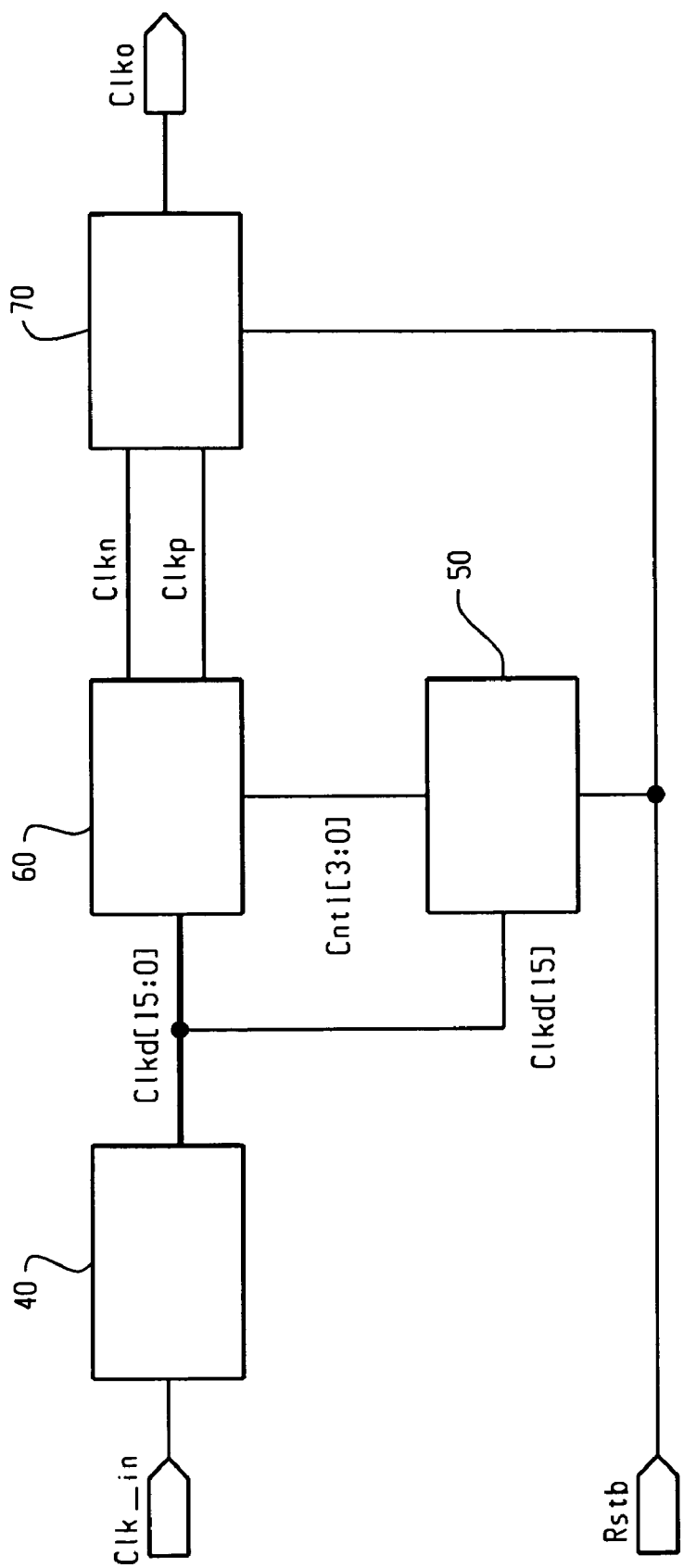
FIG. 1 is a schematic diagram of an exemplary embodiment of a clock frequency diffusing device according to the present invention.

As shown in FIG. 1, a clock frequency diffusing device according to the present invention may include a multiphase clock generator 40 that delays an input clock signal Clk_in and generates and outputs a plurality of first clock signals Clkd[15:0]. In an exemplary embodiment, the multiphase clock generator 40 may generate sixteen phase-shifted first clock signals Clkd[15:0]. The phase-shifted first clock signals Clkd[15:0] may be provided to an output component.

The output component may select one or more of the first clock signals Clkd[15:0] using random numbers (such as, but not limited to, 4-bit random numbers, Cnt1[3:0]) thereby supplying an output clock signal Clko having a diffused frequency. The output component may include, for example and without limitation, a random number generator 50 and a clock selector 60 connected to the output side of the multiphase clock signal generator 40, as well as a clock signal generator 70.

In an exemplary embodiment, the random number generator 50 may be a circuit that is reset by a reset signal Rstb and that generates arbitrary random numbers (such as, but not limited to, 4-bit random numbers), Cnt1[3:0]. The clock signal selector 60 receives the random numbers from the random number generator. The clock signal selector 60 is a circuit which selects a clock signal from among the first clock signals Clkd[15:0] using the random numbers Cnt1[3:0]. The clock signal selector 60 outputs second clock signals (e.g., two types of clock signals, Clkn and Clkp, corresponding to the falling edge and the rising edge that are opposite in phase with each other). The clock signal generator 70 is connected to the output side of the clock signal selector 60. The clock generator 70 is a circuit that is reset by the reset signal Rstb and that generates an output clock signal Clko. Output clock signal Clko has a diffused frequency relative to the input clock signal and has logic values that correspond to the second clock signals Clkn and Clkp.

Figure 2:
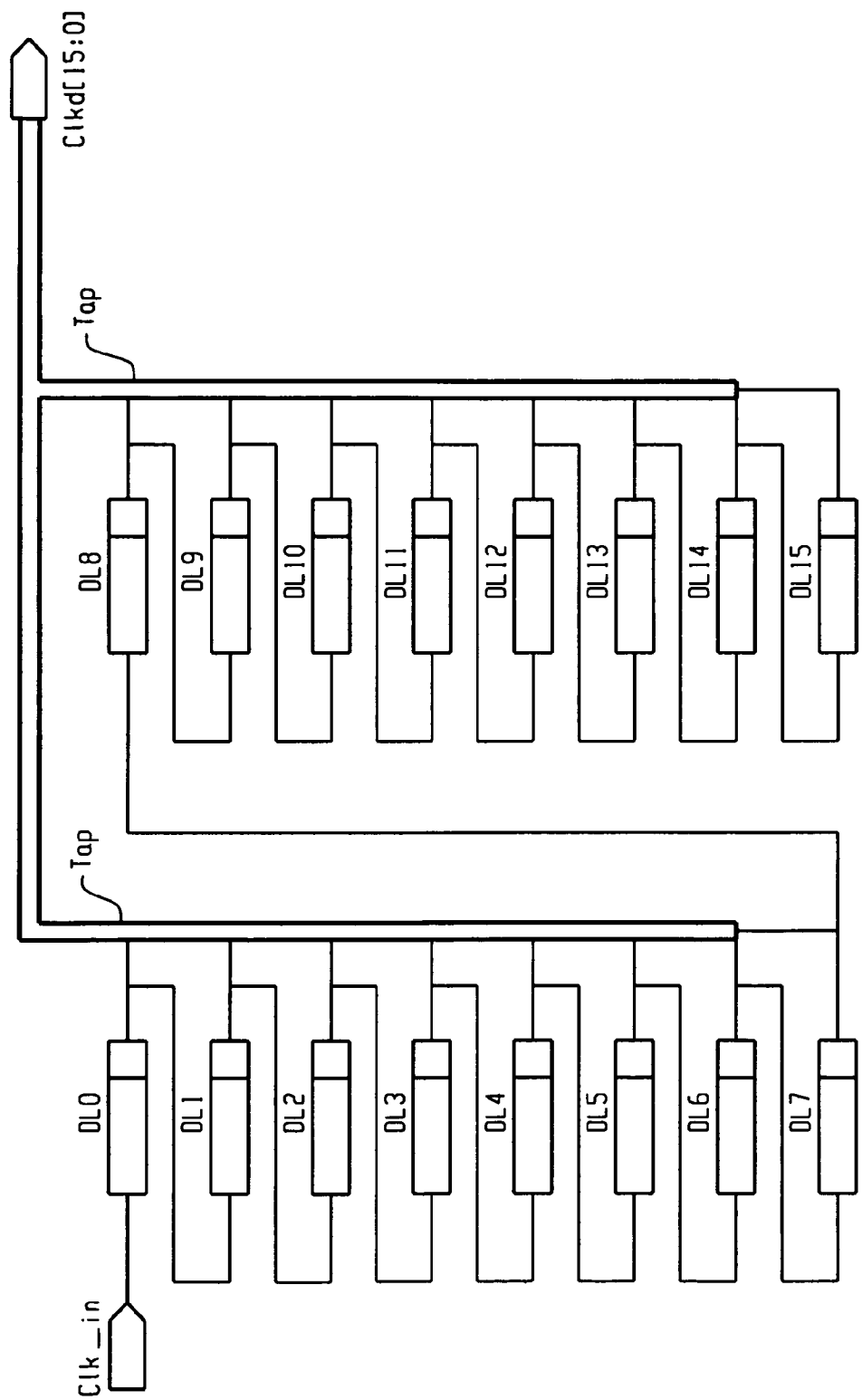
FIG. 2 is a detailed schematic diagram of an exemplary embodiment of a multiphase clock signal generator according to the present invention.

As shown in FIG. 2, an exemplary embodiment multiphase clock signal generator 40 may be a circuit that delays the input clock signal Clk_in and generates 16 first clock signals Clkd[15:0] which are out of phase. The multiphase clock generator 40 may have, for example, a configuration in which sixteen delay circuits (DL0 through DL15) are connected in tandem and the output signals of the delay circuits are output via taps (terminals).

Figure 3:
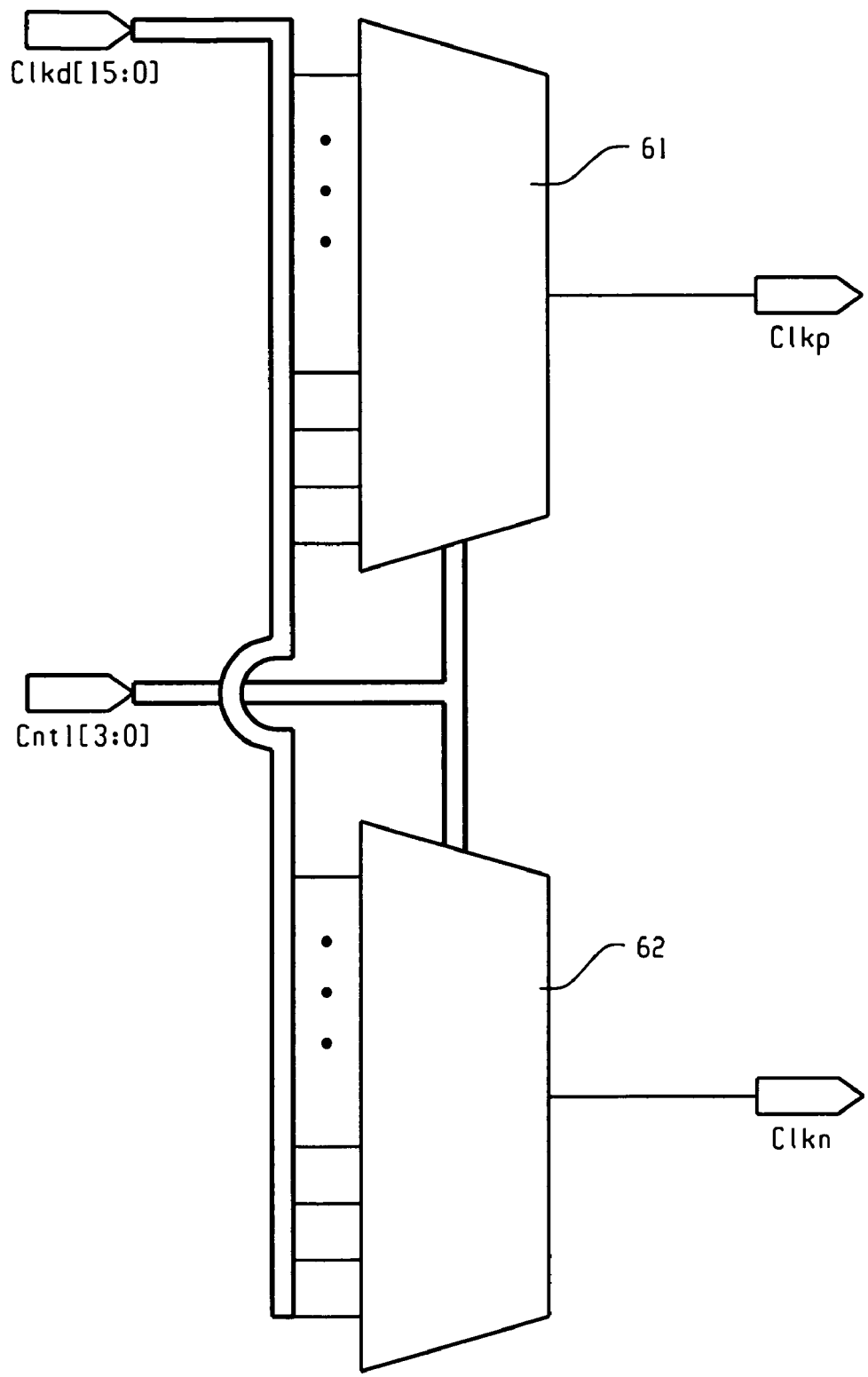
FIG. 3 is a detailed schematic diagram of a clock signal selector according to the present invention.

As shown in FIG. 3, an exemplary embodiment clock signal selector 60 may include a first selector 61 which selects from among the first clock signals Clkd[15:0], based on the 4-bit random numbers Cnt1[3:0] and outputs a second clock signal Clkp having a rising edge, and a second selector 62 which also selects from among the first clock signals Clkd[15:0], based on the 4-bit random numbers Cnt1[3:0], and outputs a second clock signal Clkn having a falling edge.

Figure 4A:
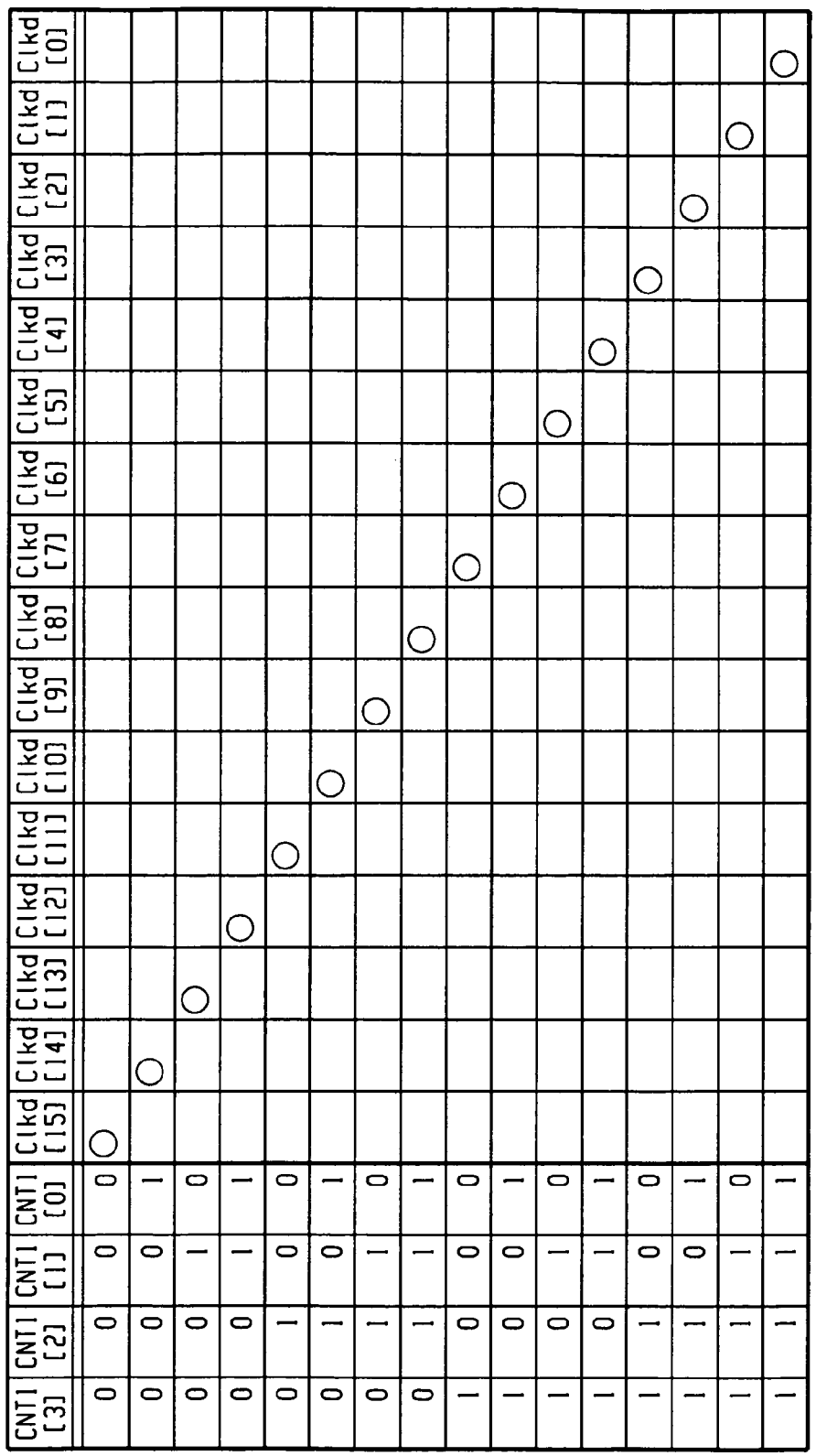
FIG. 4A is an exemplary truth table showing the output of signal selector 62 shown in FIG. 3.
Figure 4B:
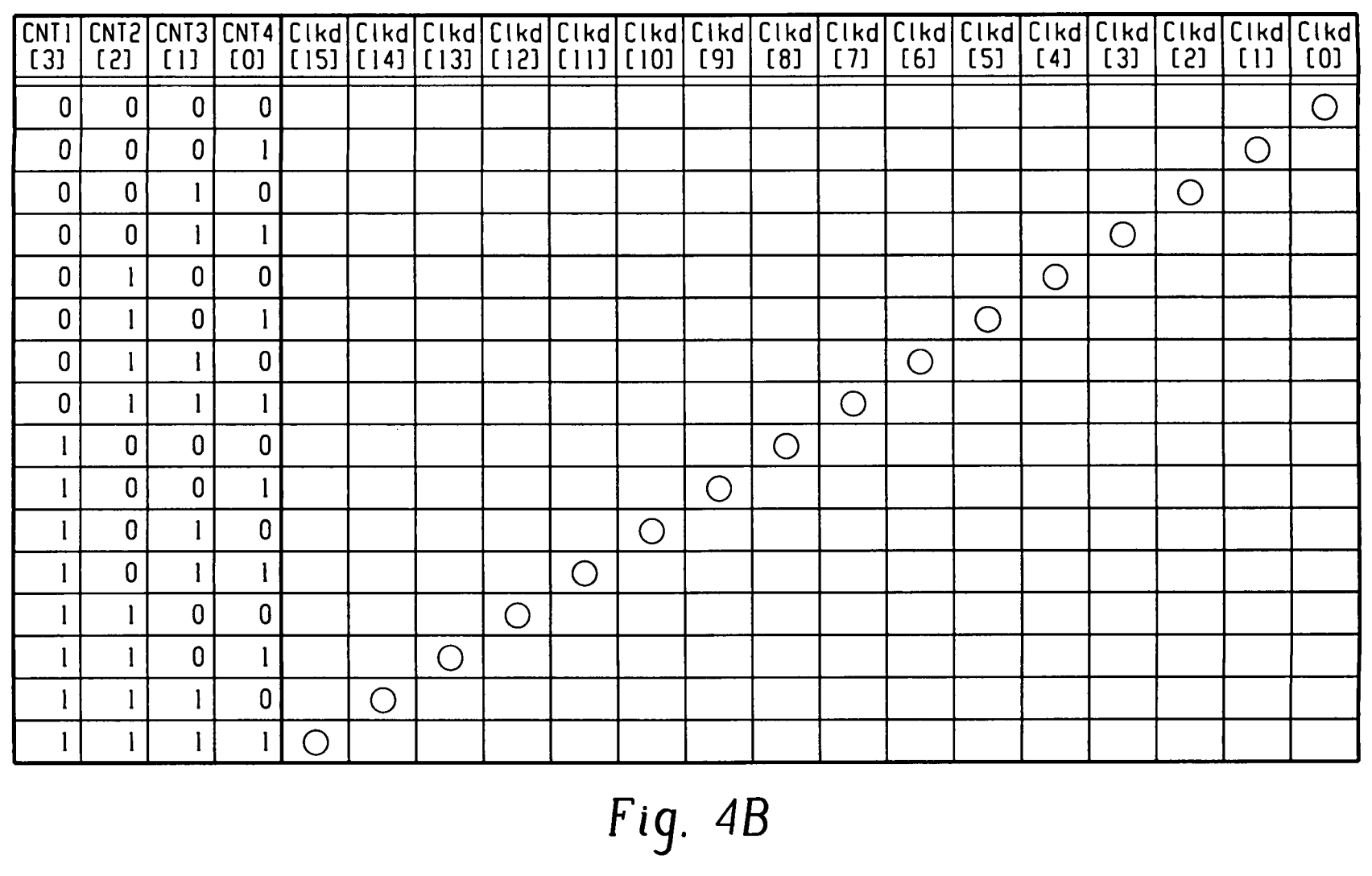

FIG. 4A is a truth table of the outputs of selector 62 (Clkn), each having a falling edge relative to the inputs (Cnt1[3:0] and Clkd[15:0]). FIG. 4B is a truth table of the outputs of selector 61 (Clkp), each having a rising edge relative to the inputs (Cnt1[3:0] and Clkd[15:0]). FIG. 5 is a truth table of the output of the clock signal generator 70 (Clko) for various input conditions (Rstb, Clkp and Clkn).

The exemplary embodiment described above operates as follows. A reset signal Rstb is first set to low to initialize the random number generator 50 and the clock generator 70. When an input clock signal Clk_in is supplied to the multiphase clock signal generator 40, first clock signals Clkd[15:0] are obtained by delaying the input clock Clk_in in the form of sixteen signals by the sixteen delay circuits (DL0 through DL15).

Clock signal Clkd[0] is delayed by a delay time of the delay circuit DL0. Clock signal Clkd[1] is delayed by a total delay time of delay circuits DL0 and DL1. Clock signal Clkd[2] is delayed by a total delay time of delay circuits DL0, DL1, and DL2. Clock signal Clkd[3] is delayed by a total delay time of delay circuits DL0, DL1, DL2, and DL3. Similarly, clock signal Clkd[15] is delayed by a total delay time of the delay circuits DL0, DL1, DL2, DL3, . . . , and DL15 in a like manner.

The random number generator 50 is initialized by the reset signal Rstb and performs counting with timing at which the falling edge of the clock signal Clkd[15] is delayed, thereby generating random numbers Cnt1[3:0]. The random number generator 50 generates random numbers Cnt1[3:0] cycled at 127 clocks, for example and is adjusted to a timing that does not compete with switching timings of the clocks Clkd[15.0], thus counting up the random numbers Cnt1[3:0].

In other embodiments, the random number generator 50 may differ from that described above. The random number generator 50 may be, for example and without limitation, a general random number generator in which sequential random numbers are uncorrelated. A round cycle is not limited to the 127 clocks but is preferably a long period or cycle to shift the frequency to a low frequency.

Two types of clock signals, Clkp and Clkn, are generated by the clock signal selector 60. As shown in FIG. 3, the clock signal selector 60 includes selectors 61 and 62. Clock signal selector 60 selects from among the clock signals Clkd[15:0] using the random numbers Cnt1[3:0], thereby outputting clock signals Clkn and Clkp. Specifically, selector 62 selects a clock signal based on the truth table shown in FIG. 4A and outputs the corresponding clock signal Clkn. The other selector 61 selects a clock signal based on the truth table shown in FIG. 4B and outputs the corresponding clock signal Clkp.

Operations according to the truth table shown in FIG. 5 are performed so that an output clock signal Clko is generated by the clock signal generator 70. When the reset signal Rstb is low, the output clock signal Clko is initialized to the output of low. On the rising edge of the clock signal Clkp, the output clock signal Clko is set to high. On the falling edge of the clock signal Clkn, the output clock signal Clko is set to low.

Figure 6A:
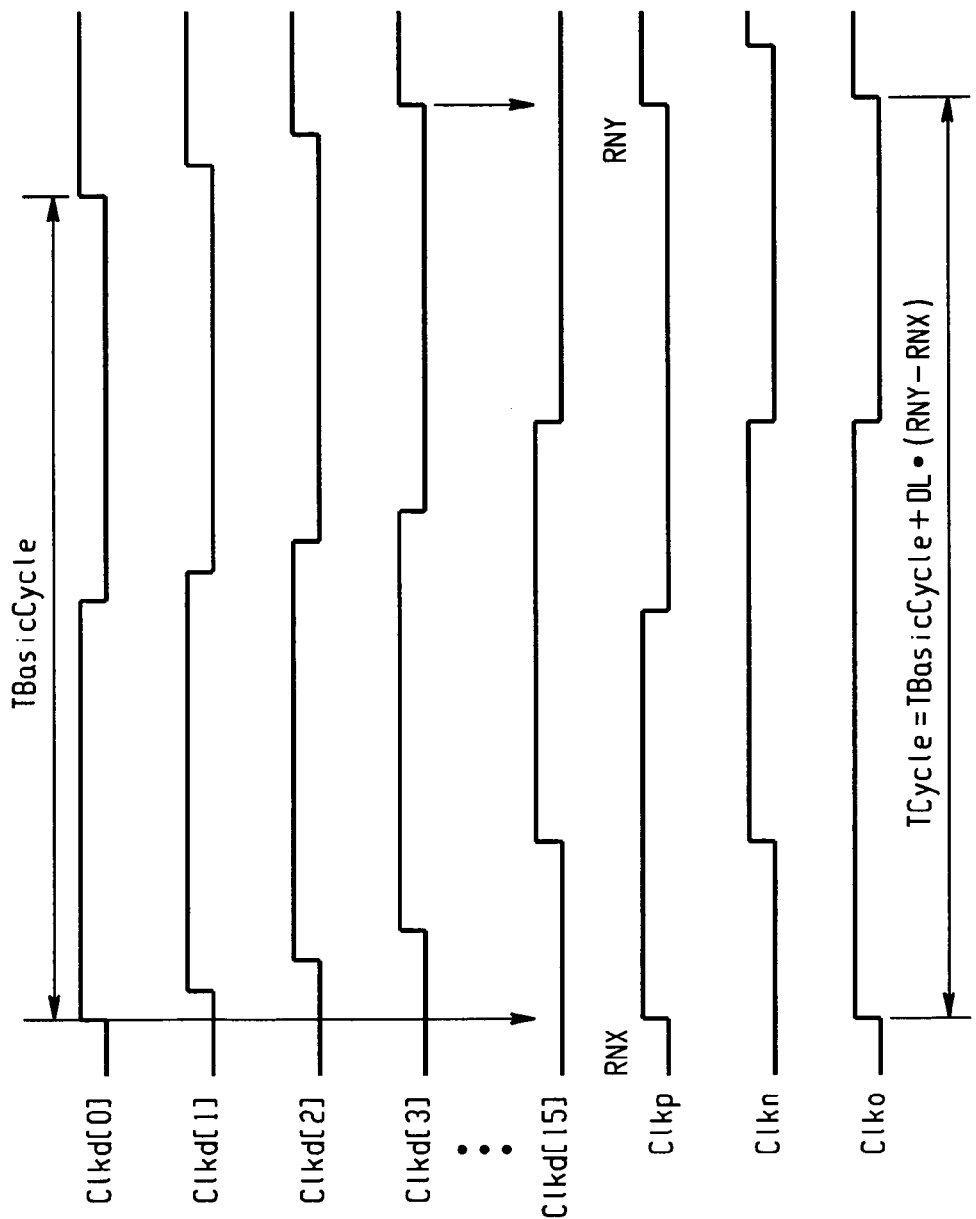
FIG. 6A is a timing chart showing the operating timing of an exemplary embodiment clock frequency diffusing device.

The differences between sequential random numbers RNX, RNY produced by the random number generator 50 are uncorrelated. Therefore, as shown in FIG. 6A, the cycle time of the output clock signal Clko includes various values in the range of a delay time width of a multiphase clock.

When the random number RNX has a value of 0 and its subsequent random number RNY has a value of 3, the time width of the falling edge takes each value shown below. A rise-fall cycle time of the output clock signal Clko is as follows:

$$Tcycle = TBasicCycle + DL0 + DL1 + DL2 + DL3$$

Assuming that the input clock signal Clk_in is 5 MHz, for example, TBasicCycle becomes 200 nS and the delay times of the delay circuits (DL0 through DL15) are set to 1.25 nS. Accordingly, the cycle time (Tcycle) is 206 nS.

A falling-falling cycle time also changes in like manner. A rise-fall cycle time and a fall-rise cycle time also take various values depending on a change in the value of each random number Cnt1[3:0].

With the above operation, the frequency can be diffused effectively with a reduced number of elements. As a result, clock signal harmonics and EMI are reduced.

Figure 14:
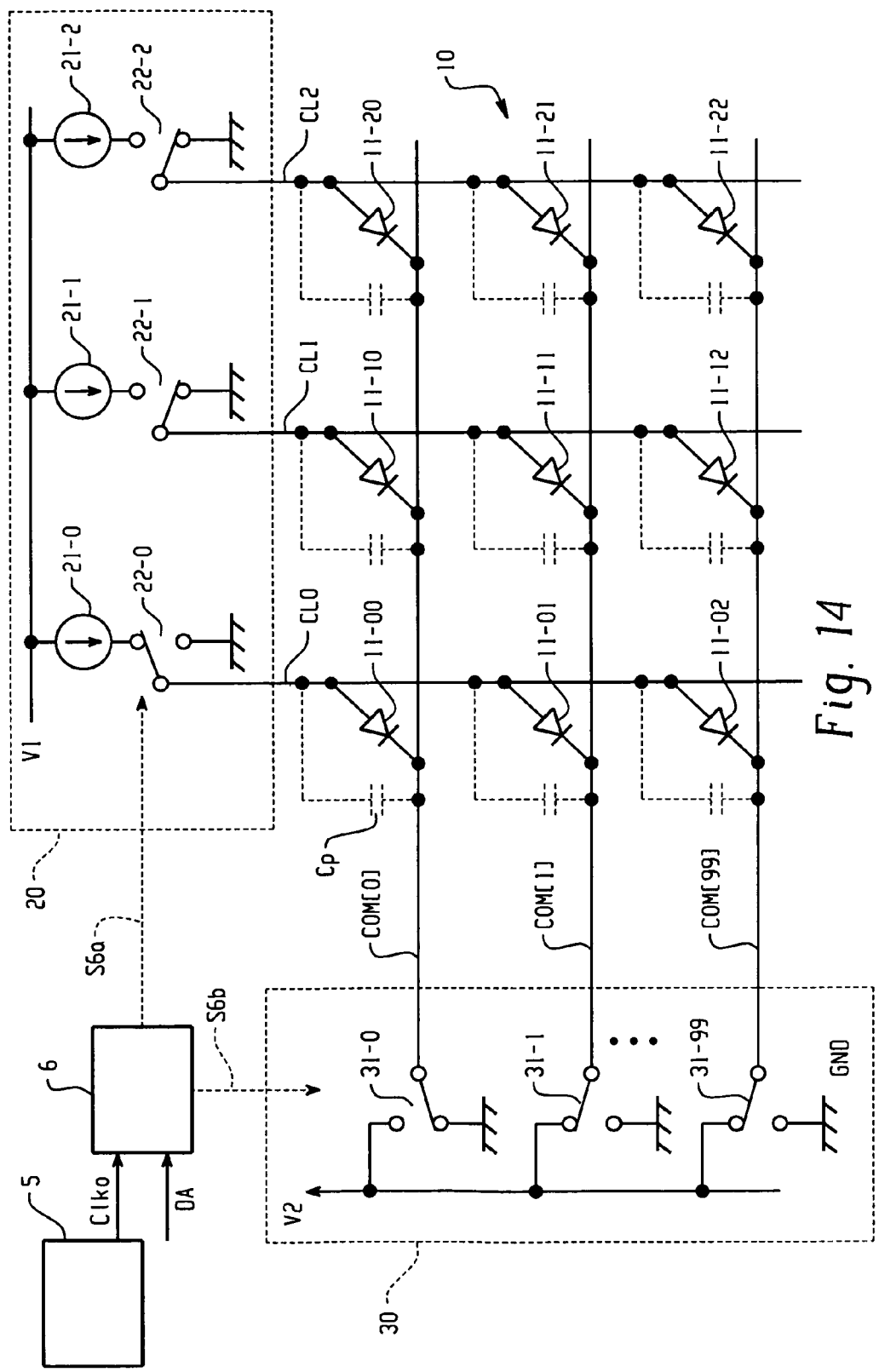
FIG. 14 is a schematic diagram of a conventional passive type organic display device.
Figure 15:
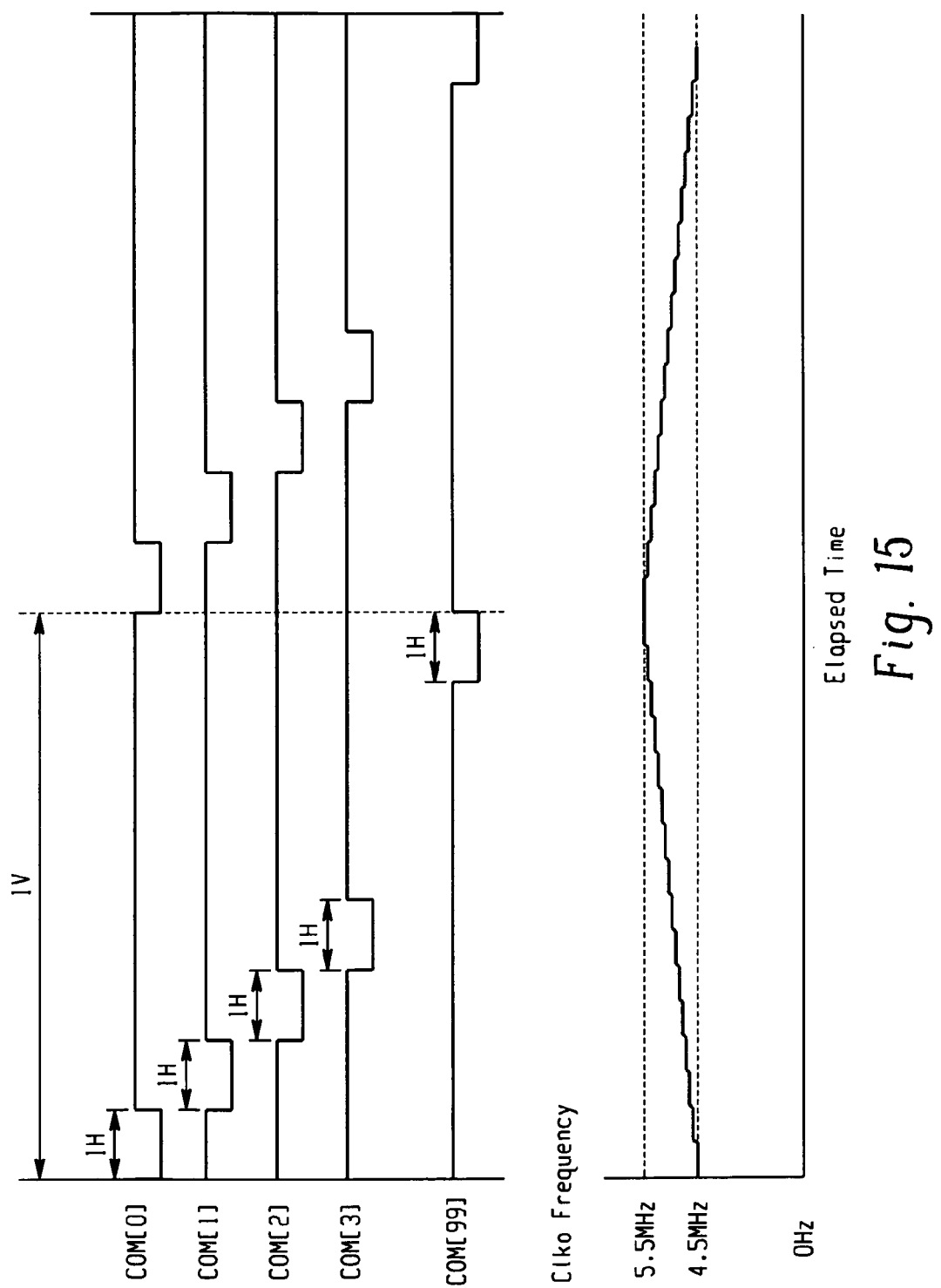
FIG. 15 is a plot illustrating a cathode drive waveform of the passive type organic display device shown in FIG. 14.

If the clock generator 5 of a conventional passive type organic display device as shown in FIG. 14 is replaced by the clock frequency diffusing device of the exemplary embodiment, it is possible to suppress a variation in frame frequency and a variation in on/off ratio. A time shift in clock variation is a delay clock with respect to the source oscillation (5 MHz). Therefore, even though the clock is counted by the light emission control circuit 6 of FIG. 14 by way of example, the time shift reaches ±20 nS even at the maximum without integrating.

Figure 6B:
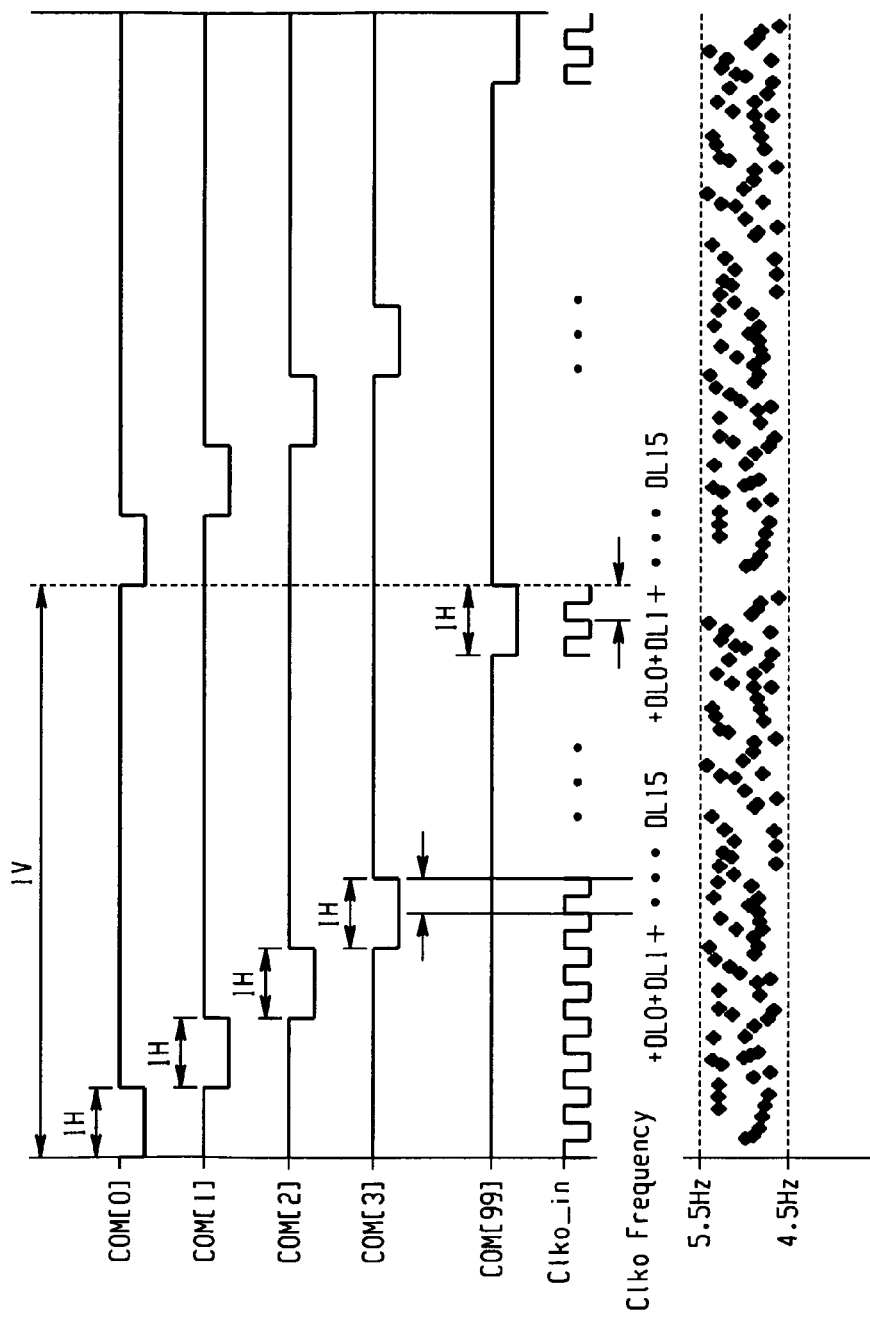
FIG. 6B is a timing chart illustrating the operating timing of a conventional passive type organic display device (as shown in FIG. 14) in which the clock generator has been replaced by an exemplary embodiment of a clock frequency diffusing device according to the present invention.

FIG. 6B is a timing chart showing the operating timing 2 where the clock signal generator of a conventional passive type organic display device as shown in FIG. 14 is replaced with an exemplary embodiment of the clock frequency diffusing device according to the present invention.

On/off ratios obtained under the Display Conditions 1 through 3 are shown below. In FIG. 6B, 1V indicates the time width of one frame and 1 H are the select periods of display lines COM[0] through COM[99].

Display condition 1 corresponds to the conditions in which no clock delay is provided.

output clock signal $Clko = 5$ MHz $(1/Clko = 200$ nS$)$ $1V = 10$ mS $(50,000 = 1/Clko)$ $1H = 100$ μS $(500 = 1/Clko)$ Display condition 2 corresponds to the conditions in which the clock delay is 0 nS (minimum) with rise timings of 1V and 1H and the clock delay is 20 nS (maximum) with fall timings of 1V and 1H.

output clock signal $Clko = 5$ MHz $(1/Clko = 200$ nS$)$ $1V = 10.00002$ mS $(50,000 = 1/Clko + 20$ nS$)$ $1H = 100.02$ μS $(500 \times 1/Clko + 20$ nS$)$ Display condition 3 corresponds to the conditions in which the clock delay is 20 nS (maximum) with rise timings of 1V and 1H and the clock delay is 0 nS (minimum) with fall timings of 1V and 1H.

output clock signal $Clko$ 5 MHz $(1/Clko = 200$ nS$)$ $1V = 9.99998$ mS $(50,000 \times 1/Clko - 20$ nS$)$ $1H$ 99.98 μS $(500 \times 1/Clko - 20$ nS$)$ The luminance of a passive type organic display device is generally expressed in the ratio (on/off ratio) of 1H to 1V. Here, each EL element 11 is turned on during a 1H period and turned off during periods other than the 1H period. The on/off ratios under the Display Conditions 1 through 3 are given as the following values.

1V=display condition 2
1H=display condition 3
on/off ratio=99.98/10000.02=0.009998
1V=display condition 3
1H=display condition 2
on/off ratio=100.02/9999.98=0.010002

The maximum and minimum variations in on/off ratio become a luminance variation of approximately 0.02%, reflecting an improvement over the performance of prior art devices.

Figure 8:
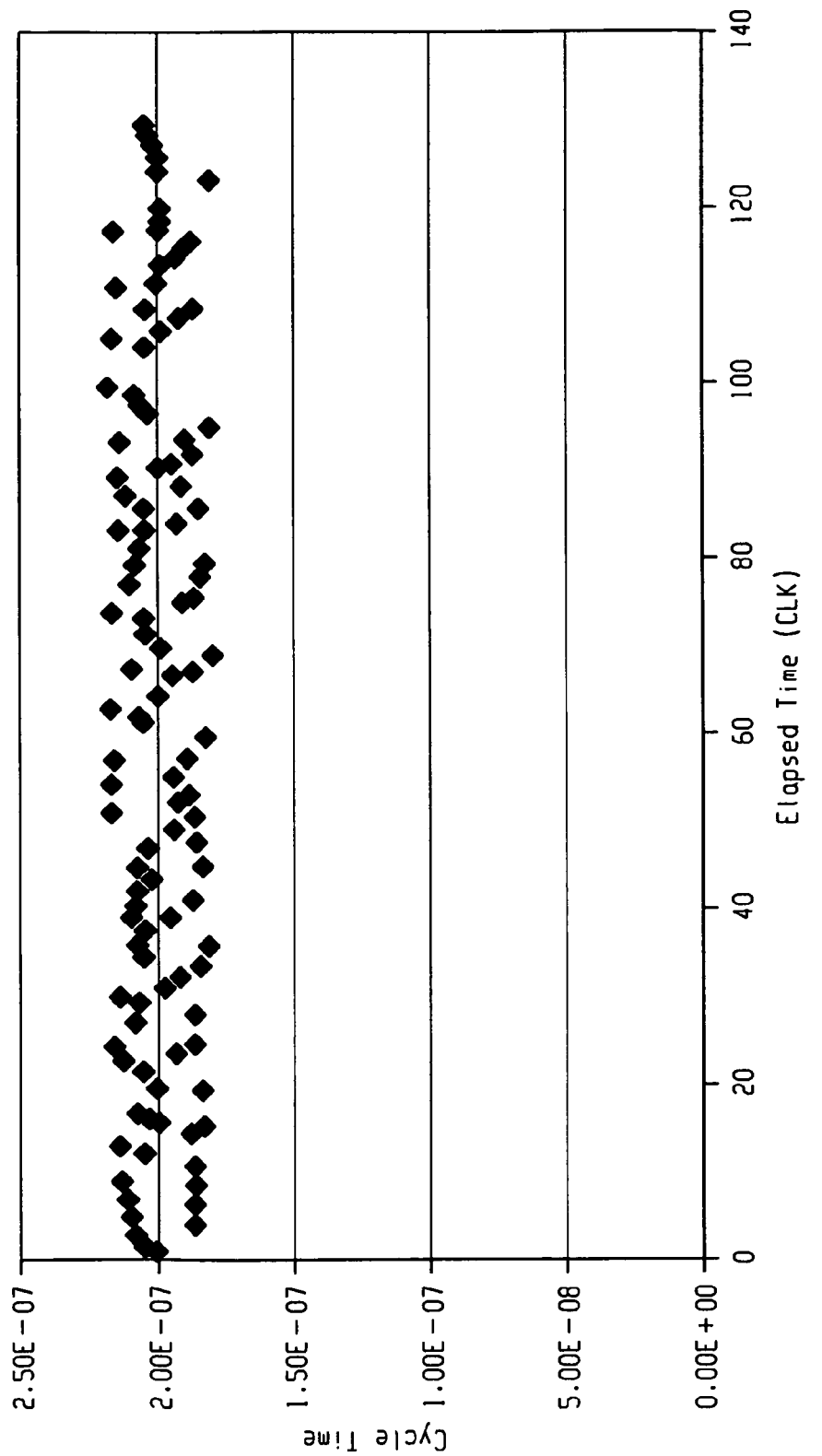
FIG. 8 is a diagram illustrating cycle time versus elapsed time in an exemplary embodiment of the present invention.
Figure 9:
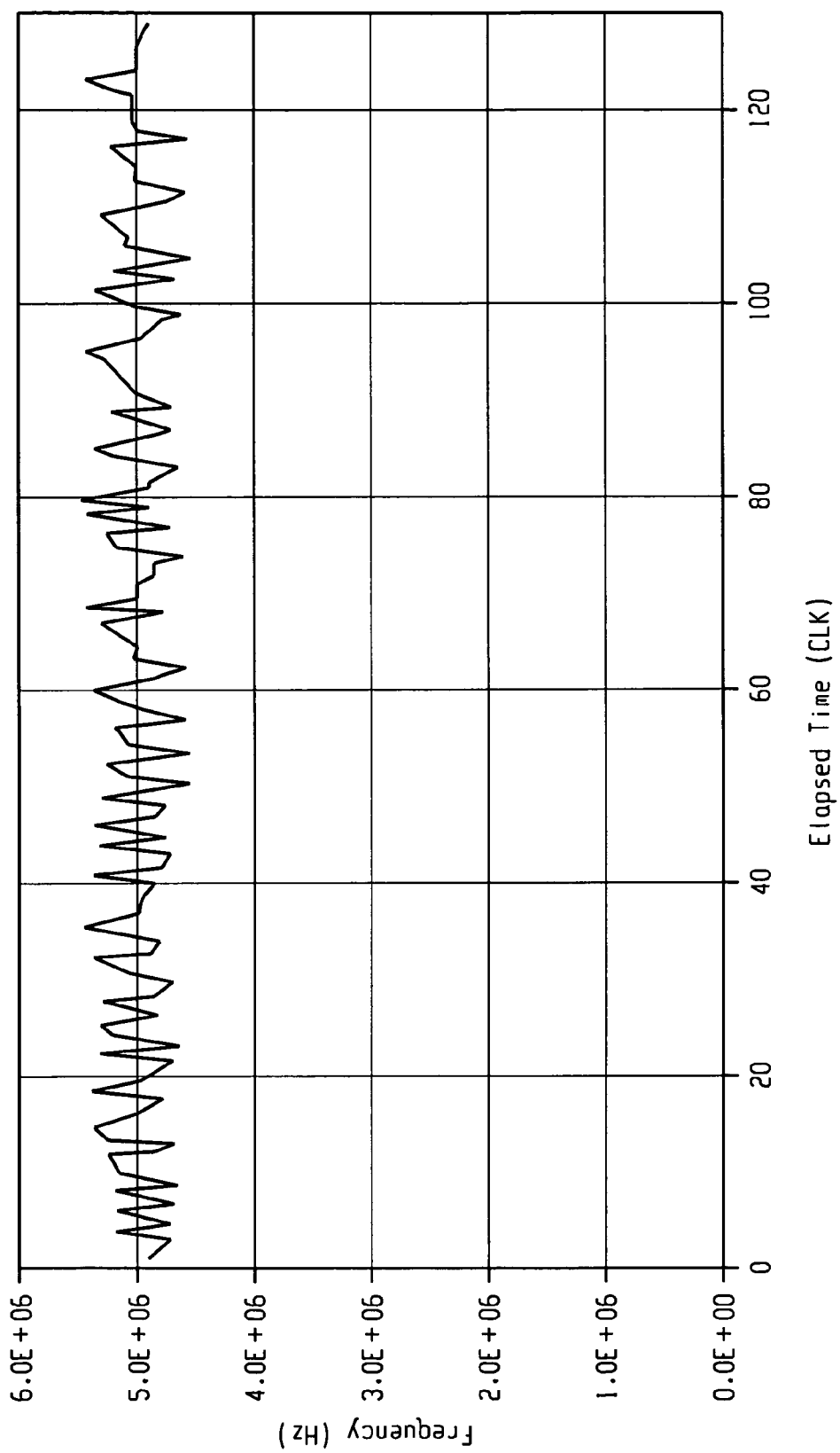
FIG. 9 is a diagram showing a graph of frequency versus time in in an exemplary embodiment of the present invention.
Figure 10:
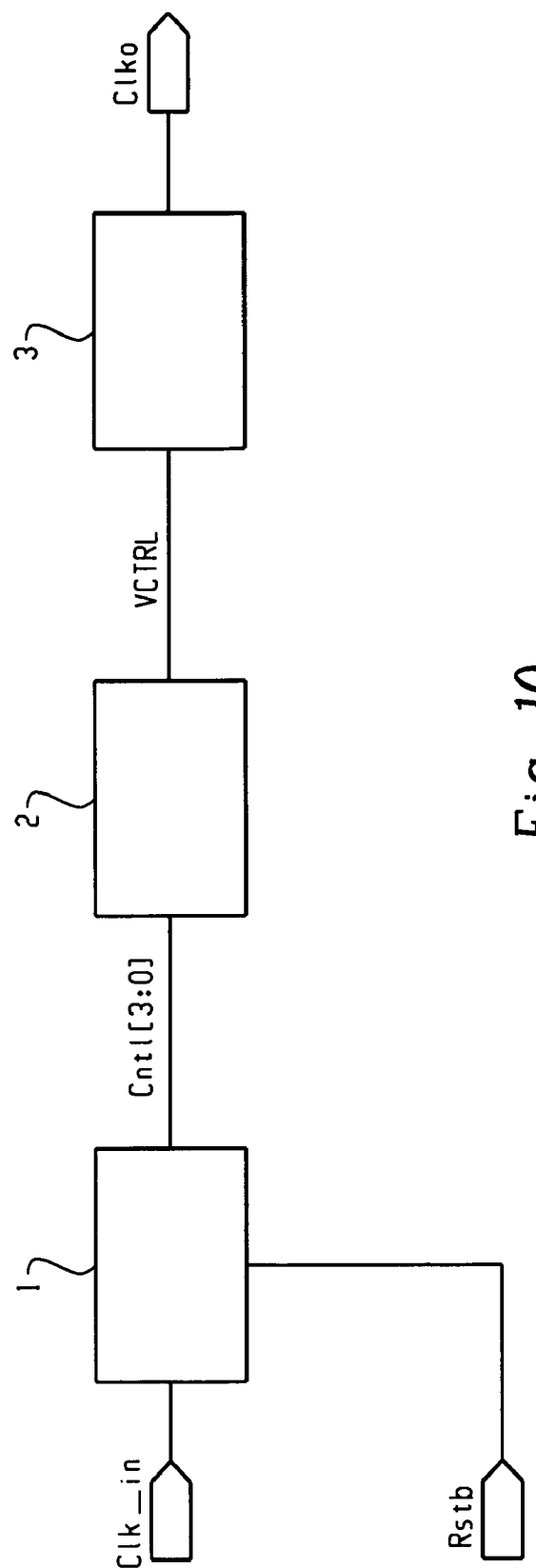
FIG. 10 is a schematic diagram of a prior art clock frequency diffusing device.
Figure 11:
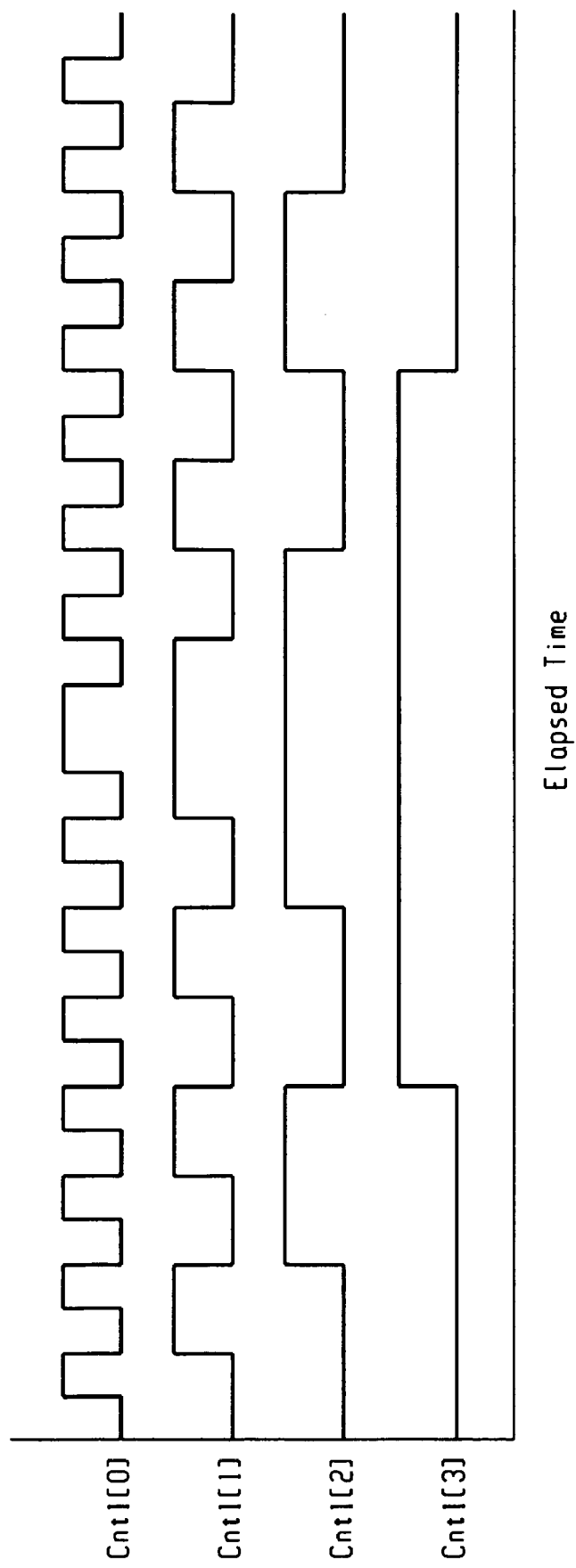
FIG. 11 is a timing chart showing the output of an up-down counter versus time for a prior art clock frequency diffusing device.
Figure 12:
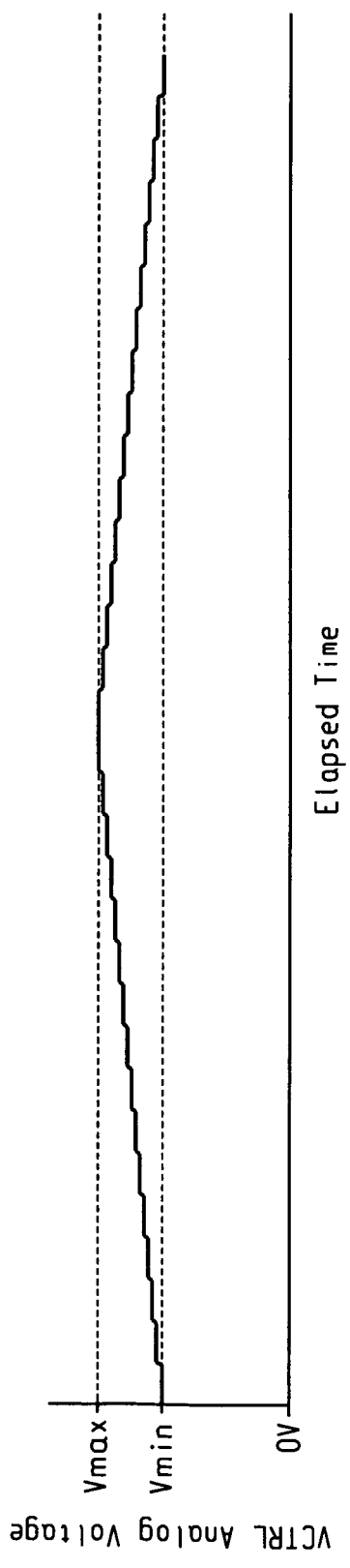
FIG. 12 is a plot of the output voltage of a voltage DAC versus time for a prior art clock frequency diffusing device.

FIG. 8 is a graph of cycle time relative to the elapsed time for the exemplary embodiment. FIG. 9 is a graph of the frequency relative to the elapsed time for the exemplary embodiment.

Figure 13:
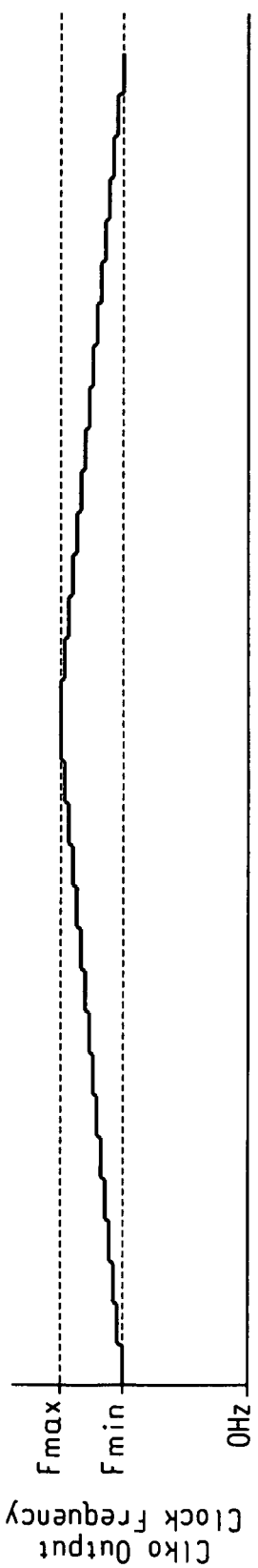
FIG. 13 is a plot illustrating the output of a prior art clock frequency diffusing device versus time.

As shown in FIGS. 8 and 9, the frequency can be diffused efficiently even though the number of stages in the multiphase clock is small. That is, embodiments of the present invention can reduce the variation in luminance while having a frequency diffusion effect of the same degree as prior art devices (see FIG. 13).

Since the clock signal selector includes both selector 61 (which outputs clock signal Clkp on the rising edge) and selector 62 (which outputs clock signal Clkn on the falling edge, opposite in phase), the frequencies at both of the rise-fall cycle time and the fall-rise cycle time can be diffused. When, for example, a logical circuit includes both rising and falling double-edged operations, harmonic components can be reduced.

Figure 7A:
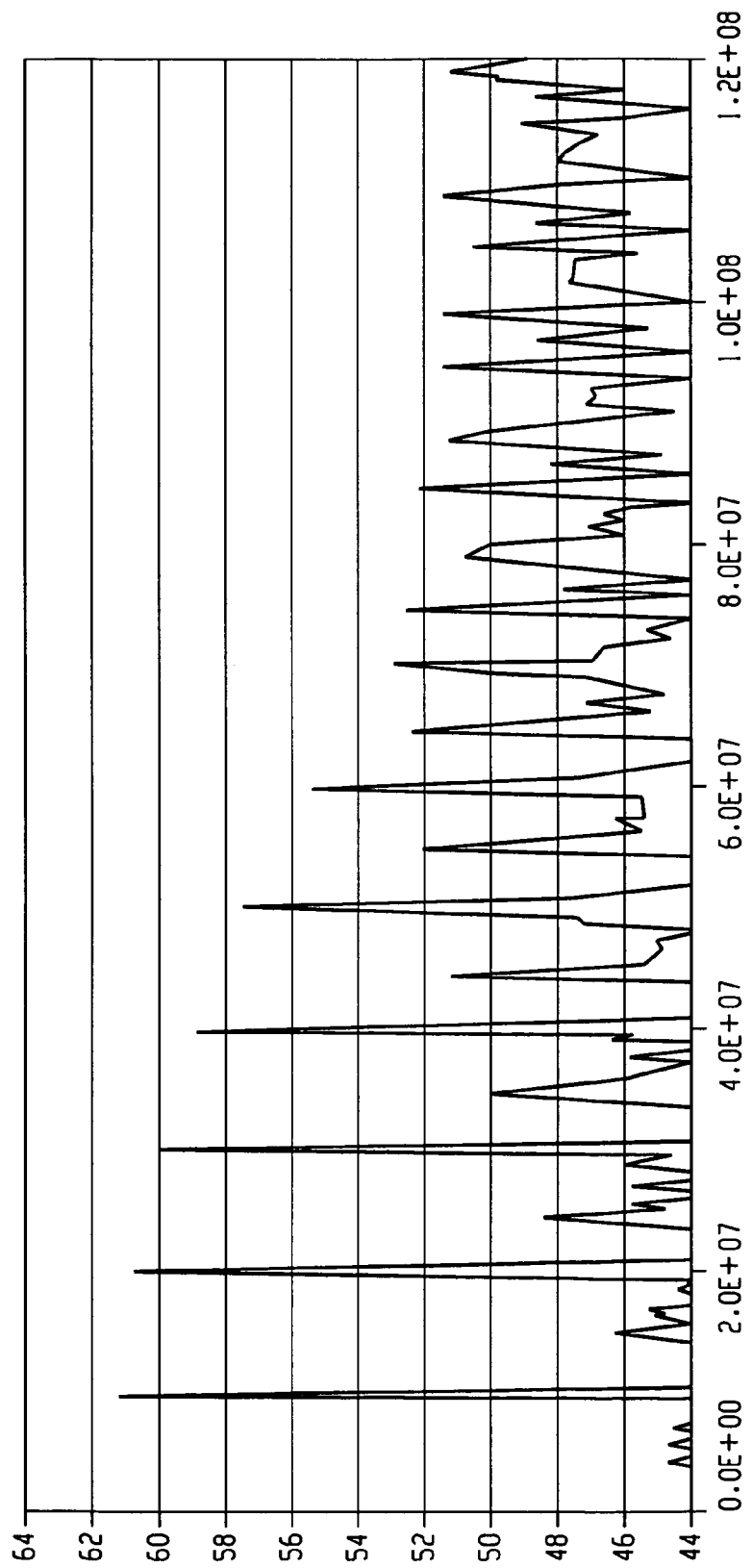
FIG. 7A is a plot showing the current spectrum obtained when a passive type organic display device is operated by a prior art frequency diffusing device.
Figure 7B:
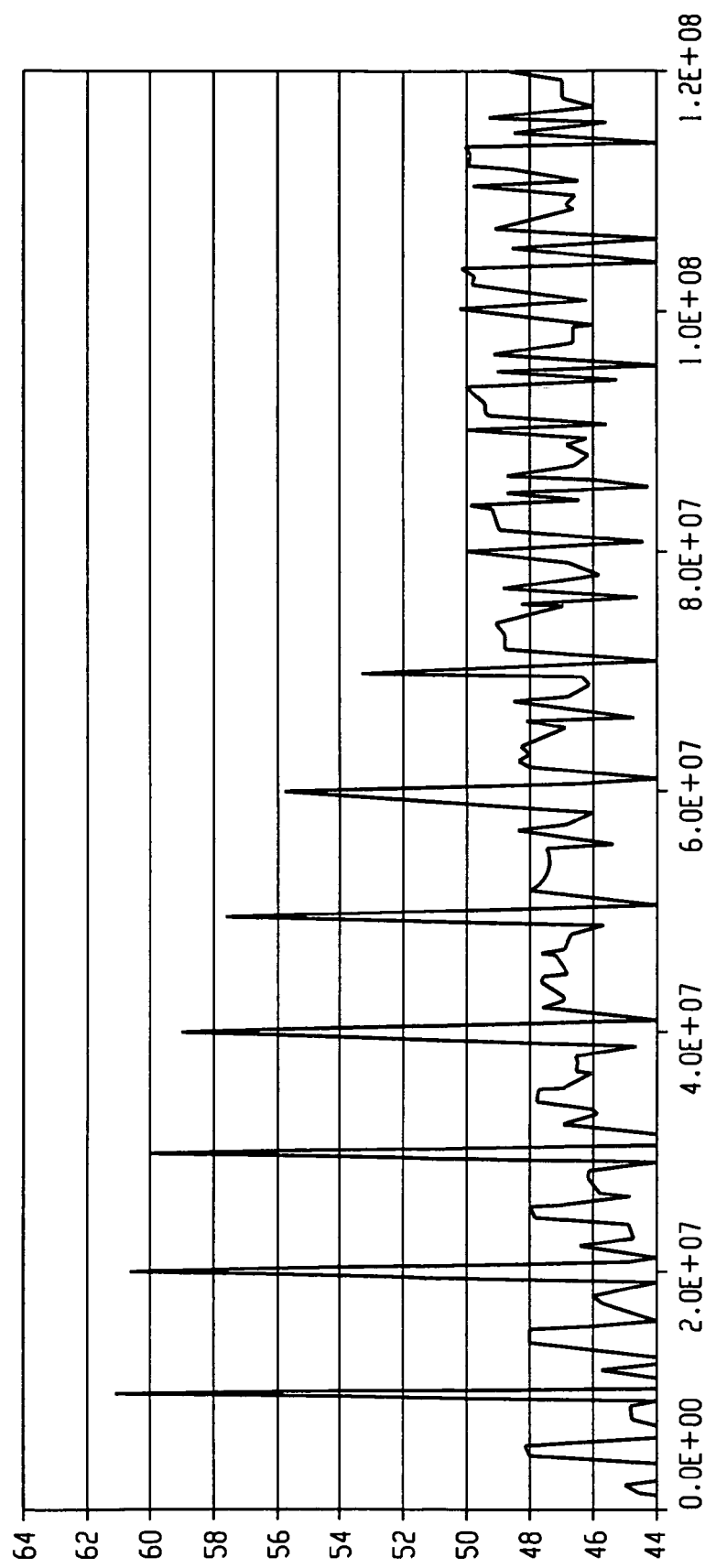
FIG. 7B is a diagram showing a current spectrum obtained when a passive type organic display device is operated by an exemplary embodiment of a frequency diffusion clock according to the present invention.

FIG. 7A is a diagram showing a current spectrum obtained when a passive type organic display device is operated by the clock signal generated by the prior art frequency diffusing devices. FIG. 7B is a diagram showing a current spectrum obtained when the passive type organic display device is operated by a clock frequency diffusion device according to the present invention.

It is within the scope of the invention to modify the various components that comprise the clock frequency diffusing device shown in FIG. 1. Further, the output clock Clko of the clock frequency diffusing device according to the present invention may be used in a display device of another type or in devices other than a display device.

While exemplary embodiments of the invention have been set forth above for the purpose of disclosure, modifications of the disclosed embodiments of the invention as well as other embodiments thereof may occur to those skilled in the art. Accordingly, it is to be understood that the inventions contained herein are not limited to the above precise embodiments and that changes may be made without departing from the scope of the invention as defined by the claims. Likewise, it is to be understood that the invention is defined by the claims and it is not necessary to meet any or all of the stated advantages or objects of the invention disclosed herein to fall within the scope of the claims, since inherent and/or unforeseen advantages of the present invention may exist even though they may not have been explicitly discussed herein.

What is claimed is:
1. A clock frequency diffusing device comprising:
a multiphase clock signal generator outputting a plurality of different phase-adjusted first clock signals from at least one input clock signal;

an output circuit, including a random number generator having at least the first clock signals as inputs and a second clock signal as an output, the second clock signal having a frequency that varies with time, the output circuit generating a diffused frequency output clock signal on the second clock signal from the first clock signals utilizing an output of the random number generator;

wherein the output circuit is configured to select a rising edge of the diffused frequency output clock signal from a first one of the plurality of different phase-adjusted first clock signals and a falling edge of the diffused frequency output clock signal from a second one of the plurality of different phase-adjusted first clock signals.

2. A clock frequency diffusing device comprising:

a multiphase clock sitmal generator outputting a plurality of different phase-adjusted first clock signals from at least one input clock signal;

an output circuit, including a random number generator, having at least the first clock signals as inputs and a second clock signal as an output, the output circuit generating a diffused frequency output clock signal on the second clock signal from the first clock signals utilizing an output of the random number generator, the output circuit including a voltage-to-frequency converter;

wherein the output circuit is configured to select a rising edge of the diffused frequency output clock signal from a first one of the plurality of different phase-adjusted first clock signals and a falling edge of the diffused frequency output clock signal from a second one of the plurality of different phase-adjusted first clock signals.

3. A method for generating a diffused frequency clock signal, comprising the steps of:

converting an input clock signal into a plurality of different phase-adjusted clock signals;

continuously randomly selecting among the plurality of phase-adjusted clock signals;

generating the diffused frequency clock signal from the continuously randomly selected phase-adjusted clock signals; and driving a passive type organic display device with the diffused frequency clock signal, wherein the passive type organic display device includes a light emission control circuit receiving the diffused frequency clock signal, the driving step comprising:

transmitting a first switch changeover signal to an anode drive circuit;

transmitting a second switch changeover signal to a cathode drive circuit; and using a first output from the anode drive circuit and a second output from the cathode drive circuit to drive a passive drive type display panel.

4. The clock frequency diffusing device of claim 1, wherein the plurality of different phase-adjusted first clock signals are a plurality of different phase-delayed first clock signals, respectively delayed from the input clock signal.

5. The clock frequency diffusing device of claim 1, wherein the output circuit includes:

a rising edge switch selecting a first one of the different phase-adjusted first clock signals based upon the output of the random number generator;

a falling edge switch selecting a second one of the different phase-adjusted first clock signals based upon the output of the random number generator; and a clock signal generator having the selected first and second ones of the different phase-adjusted first clock signals as inputs and the diffused frequency output clock signal as an output, wherein the rising edge of the diffused frequency output clock signal is based upon the selected first one of the different phase-adjusted first clock signals and wherein the falling edge of the diffused frequency output clock signal is based upon the selected second one of the different phase-adjusted first clock signals.

6. The clock frequency diffusing device of claim 1, wherein the output circuit includes means for randomly selecting rising and falling edges of the diffused frequency output clock signal from separate ones of the plurality of different phase-adjusted first clock signals.

7. The clock frequency diffusing device of claim 1, wherein each of the different phase-adjusted first clock signals has a delay from the at least one input clock signal equal to a magnitude of a delay constant.

8. The clock frequency diffusing device of claim 7, wherein the delay from the input clock signal of each different phase-adjusted first clock signal differs from the delay from the input clock signal for every other of the plurality of plurality of different phase-adjusted first clock signals.

9. The clock frequency diffusing device of claim 1, wherein the output circuit is configured to select among the plurality of different phase-adjusted first clock signals based upon an output of the random number generator.

10. The clock frequency diffusing device of claim 1, wherein the second clock signal has a duty cycle that varies with time.

11. The clock frequency diffusing device of claim 10, wherein a duration of the ON time of the duty cycle of the second clock signal varies with time.

12. The clock frequency diffusing device of claim 10, wherein a duration of the OFF time of the duty cycle of the second clock signal varies with time.

13. The clock frequency diffusing device of claim 2, wherein the plurality of different phase-adjusted first clock signals are a plurality of different phase-delayed first clock signals, respectively delayed from the input clock signal.

14. The clock frequency diffusing device of claim 2, wherein the output circuit includes:

a rising edge switch selecting a first one of the different phase-adjusted first clock signals based upon the output of the random number generator;

a falling edge switch selecting a second one of the different phase-adjusted first clock signals based upon the output of the random number generator; and a clock signal generator having the selected first and second ones of the different phase-adjusted first clock signals as inputs and the diffused frequency output clock signal as an output, wherein the rising edge of the diffused frequency output clock signal is based upon the selected first one of the different phase-adjusted first clock signals and wherein the falling edge of the diffused frequency output clock signal is based upon the selected second one of the different phase-adjusted first clock signals.

15. The clock frequency diffusing device of claim 2, wherein the output circuit includes means for randomly selecting rising and falling edges of the diffused frequency output clock signal from separate ones of the plurality of different phase-adjusted first clock signals.

16. The clock frequency diffusing device of claim 2, wherein each of the different phase-adjusted first clock signals has a delay from the at least one input clock signal equal to a magnitude of a delay constant.

17. The clock frequency diffusing device of claim 16, wherein the delay from the input clock signal of each different phase-adjusted first clock signal differs from the delay from the input clock signal for every other of the plurality of plurality of different phase-adjusted first clock signals.

18. The clock frequency diffusing device of claim 2, wherein the output circuit is configured to select among the plurality of different phase-adjusted first clock signals based upon an output of the random number generator.

19. The clock frequency diffusing device of claim 2, wherein the second clock signal has a duty cycle that varies with time.

20. The clock frequency diffusing device of claim 19, wherein a duration of the ON time of the duty cycle of the second clock signal varies with time.

21. The clock frequency diffusing device of claim 19, wherein a duration of the OFF time of the duty cycle of the second clock signal varies with time.

22. The method of claim 3 wherein the continuously randomly selecting step includes selecting a rising edge clock signal and a falling edge clock signal from separate ones of the plurality of different phase-adjusted clock signals.

23. The method of claim 22 wherein the step of generating the diffused frequency clock signal from the continuously randomly selected phase-adjusted clock signals includes generating a rising edge of the diffused frequency clock signal from the selected rising edge clock signal and generating a falling edge of the diffused frequency clock signal from the selected falling edge clock signal.

24. The method of claim 23, wherein the step of continuously randomly selecting among the plurality of phase-adjusted clock signals occurs at least once for each period of the input clock signal.

* * * * *

UNITED STATES PATENT AND TRADEMARK OFFICE
CERTIFICATE OF CORRECTION

PATENT NO.        : 8,164,376 B2
APPLICATION NO.   : 12/033050
DATED             : April 24, 2012
INVENTOR(S)       : Shuji Furuichi It is certified that error appears in the above-identified patent and that said Letters Patent is hereby corrected as shown below:

On the Title Page, Item [75] change inventor last name from "Furichi" to "Furuichi"

Signed and Sealed this
Third Day of July, 2012

David J. Kappos
*Director of the United States Patent and Trademark Office*